(12) United States Patent
Mao et al.

(10) Patent No.: US 10,518,387 B2
(45) Date of Patent: Dec. 31, 2019

(54) GRINDING ELEMENT, GRINDING WHEEL AND MANUFACTURING METHOD OF SEMICONDUCTOR PACKAGE USING THE SAME

(71) Applicant: Taiwan Semiconductor Manufacturing Co., Ltd., Hsinchu (TW)

(72) Inventors: Yi-Chao Mao, Taoyuan County (TW); Chin-Chuan Chang, Hsinchu County (TW); Jing-Cheng Lin, Hsinchu (TW); Wen-Hua Chang, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/652,244

(22) Filed: Jul. 18, 2017

(65) Prior Publication Data

US 2019/0022827 A1  Jan. 24, 2019

(51) Int. Cl.
*B24D 7/06*  (2006.01)
*H01L 21/56*  (2006.01)
*H01L 21/48*  (2006.01)
*H01L 21/78*  (2006.01)
*H01L 23/31*  (2006.01)
*H01L 23/538*  (2006.01)

(52) U.S. Cl.
CPC .............. *B24D 7/066* (2013.01); *B24D 7/06* (2013.01); *H01L 21/486* (2013.01); *H01L 21/4853* (2013.01); *H01L 21/4857* (2013.01); *H01L 21/561* (2013.01); *H01L 21/565* (2013.01); *H01L 21/78* (2013.01); *H01L 23/3114* (2013.01); *H01L 23/5383* (2013.01); *H01L 23/5384* (2013.01); *H01L 23/5386* (2013.01); *H01L 23/5389* (2013.01)

(58) Field of Classification Search
CPC .................................. B24D 7/066; B24D 7/06
USPC ...................................................... 451/520–550
See application file for complete search history.

(56) References Cited

U.S. PATENT DOCUMENTS

| | | | | |
|---|---|---|---|---|
| 2,082,150 A | * | 6/1937 | Coffman | B24D 7/04 428/612 |
| 3,639,316 A | * | 2/1972 | Argiro | B24D 11/02 106/224 |
| 3,778,406 A | * | 12/1973 | Klotzer et al. | C08J 5/10 152/565 |
| 3,789,096 A | * | 1/1974 | Church | C04B 41/009 264/122 |
| 4,588,420 A | * | 5/1986 | Charvat | B24D 13/00 51/298 |
| 5,476,416 A | * | 12/1995 | Kodate | B24D 3/22 451/103 |

(Continued)

*Primary Examiner* — George B Nguyen
(74) *Attorney, Agent, or Firm* — JCIPRNET

(57) ABSTRACT

A grinding element mounted on a grinding wheel and a grinding wheel containing the same are provided for grinding. The grinding element includes a grinding tooth, and the grinding tooth includes a grinding material having a framework structure and pores distributed in the framework structure. The framework structure includes a bond material and abrasive particles that are bonded by the bond material. A pore size of the pores is larger than 40 microns but smaller than 70 microns. A manufacturing method for semiconductor packages using the same is also provided.

19 Claims, 9 Drawing Sheets

(56) References Cited

U.S. PATENT DOCUMENTS

| | | | | |
|---|---|---|---|---|
| 5,578,362 | A * | 11/1996 | Reinhardt | B24B 37/26 257/E21.219 |
| 6,037,019 | A * | 3/2000 | Kooyer | B05D 1/00 427/185 |
| 6,196,911 | B1 * | 3/2001 | Preston | B24D 18/00 451/548 |
| 6,485,533 | B1 * | 11/2002 | Ishizaki | B24D 3/10 51/293 |
| 6,575,824 | B2 * | 6/2003 | Kuramochi | B24B 37/24 451/526 |
| 2001/0011004 | A1 * | 8/2001 | Yamaguchi | B24B 7/228 451/548 |
| 2002/0016139 | A1 * | 2/2002 | Hirokawa | B24B 37/24 451/54 |
| 2005/0020189 | A1 * | 1/2005 | Annen | B24D 3/26 451/41 |
| 2006/0211353 | A1 * | 9/2006 | Kodani | B24D 7/06 451/548 |
| 2007/0254568 | A1 * | 11/2007 | Park | B24D 7/066 451/548 |
| 2010/0035530 | A1 * | 2/2010 | Gosamo | B24D 3/06 451/548 |
| 2010/0261420 | A1 * | 10/2010 | Kitajima | B24D 3/14 451/548 |
| 2014/0141699 | A1 * | 5/2014 | Yanase | B23F 21/02 451/47 |
| 2014/0242893 | A1 * | 8/2014 | Oehler | B24D 11/02 451/539 |
| 2015/0183086 | A1 * | 7/2015 | Mejean | B24D 3/346 51/309 |
| 2016/0151885 | A1 * | 6/2016 | Sarangi | B24D 3/18 51/307 |
| 2016/0151886 | A1 * | 6/2016 | Sarangi | B24D 3/18 51/308 |

* cited by examiner

GRINDING ELEMENT, GRINDING WHEEL AND MANUFACTURING METHOD OF SEMICONDUCTOR PACKAGE USING THE SAME

BACKGROUND

Grinding is one of the most common technology for thinning the dies of the semiconductor wafer and for reducing the thickness of the semiconductor packages. As many integrated circuits and electronic devices are manufactured from the semiconductor wafer, well controlled wafer thinning or package thinning is beneficial and valuable for the device performance and reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
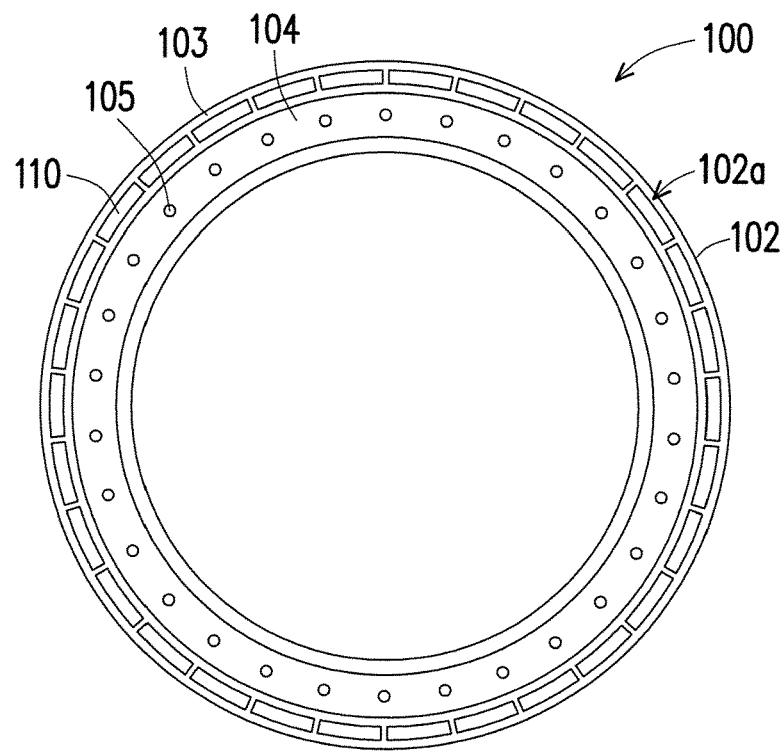
FIG. 1A is a schematic bottom view illustrating a grinding wheel according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
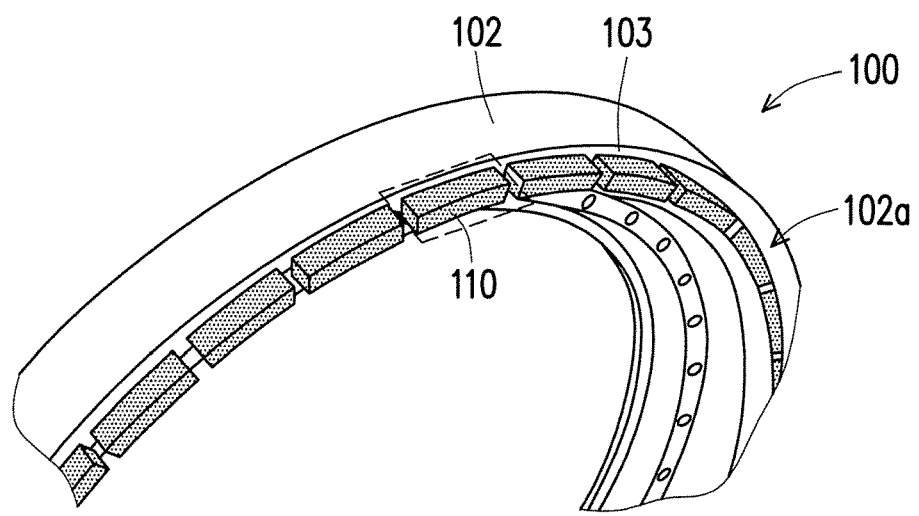
FIG. 1B is a schematic three-dimensional view illustrating a portion of the grinding wheel according to some exemplary embodiments of the present disclosure.
Figure 1C:
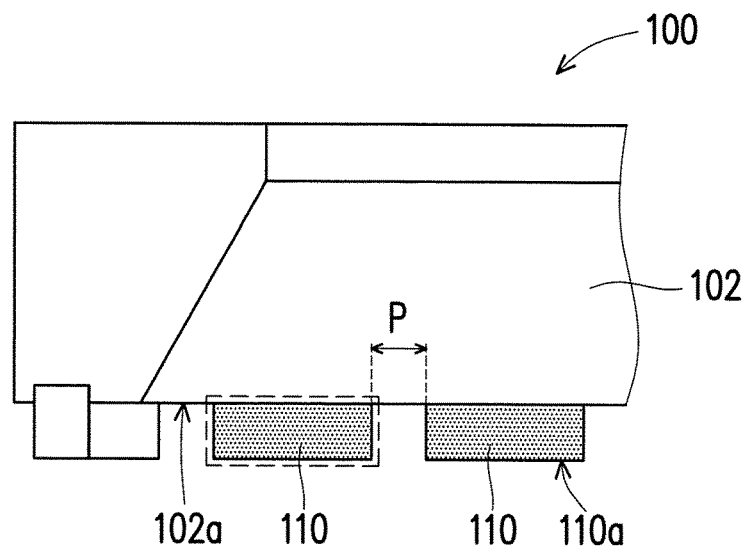
FIG. 1C is a schematic cross sectional view illustrating a portion of a grinding wheel according to some exemplary embodiments of the present disclosure.
Figure 1D:
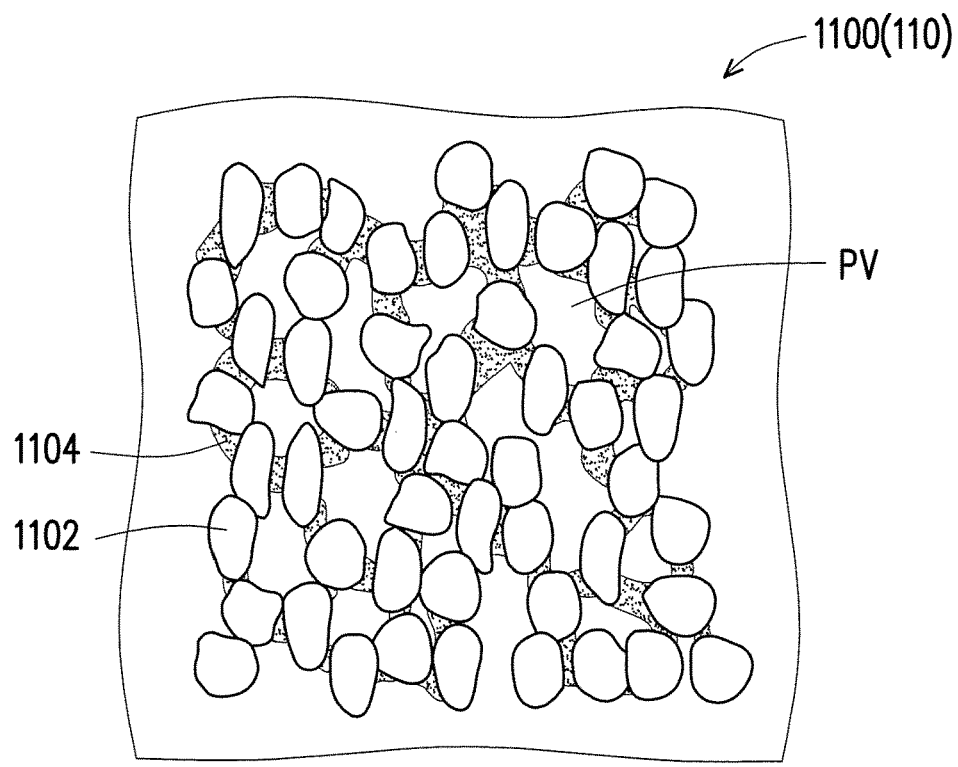
FIG. 1D is a schematic enlarged cross sectional view illustrating a portion of a grinding tooth of a grinding wheel according to some exemplary embodiments of the present disclosure.

FIG. 1A is a schematic bottom view illustrating a grinding wheel according to some exemplary embodiments of the present disclosure. FIG. 1B is a schematic three-dimensional view illustrating a portion of the grinding wheel according to some exemplary embodiments of the present disclosure. FIG. 1C is a schematic cross sectional view illustrating a portion of a grinding wheel according to some exemplary embodiments of the present disclosure. FIG. 1D is a schematic enlarged cross sectional view illustrating a portion of a grinding tooth of a grinding wheel according to some exemplary embodiments of the present disclosure.

Figure 2:
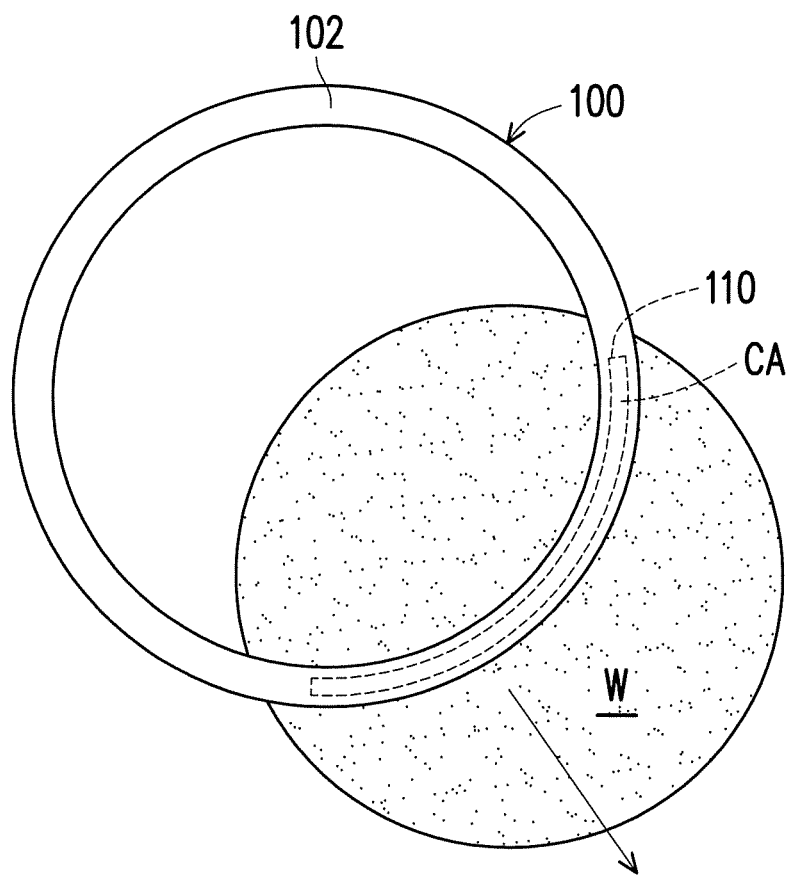
FIG. 2 is a schematic top view showing the relative grinding trajectory of the grinding wheel over the wafer to be ground in a manufacturing process of a semiconductor package according to some exemplary embodiments of the present disclosure.

Referring to FIGS. 1A-1C, in some embodiments, a grinding wheel 100 includes a ring shaped metal base 102 and a plurality of grinding teeth 110 mounted on a bottom surface 102a of the metal base 102. In some embodiments, the grinding wheel 100 may further includes a structural reinforcing element or a stress or impact absorbing layer. In some embodiments, the material of the metal base 102 includes aluminum, steel, molybdenum, molybdenum alloys, titanium or titanium alloys. In some embodiments, the grinding tooth functions as a grinding element mounted on the base (main body) of the grinding wheel to exert grinding ability toward the structure/layer to be ground. In some embodiments, the grinding teeth 110 may be arranged on the bottom surface 102a of the ring shaped metal base 102 and arranged on an outer rim portion 103 of the ring shaped metal base 102. In some embodiments, the ring-shaped metal base 102 may have holes 105 arranged at an inner rim portion 104 of the ring-shaped metal base 102. In some embodiments, the plurality of grinding teeth 110 are separate from one another and are arranged side by side with a uniform pitch P between one another as shown in FIG. 1C. In some embodiments, only one type of grinding teeth is utilized and the grinding teeth 110 may be arranged with a uniform pitch P. In accordance with the embodiments, the pitch P can be modified based on product design or the requirements of grinding capability. In alternative embodiments, various types of grinding teeth may be arranged with different pitches. In some embodiments, the grinding tooth 110 is shaped as a brick-like rectangular block and the plurality of grinding teeth 110 are arranged short-side by short-side along the outer rim portion 103 of the ring-shaped metal base 102. In FIG. 1C, in certain embodiments, a lower surface 110a of the grinding tooth 110 is the contact surface during the grinding process and the contact surface 110a will be in direct contact with a wafer surface of the wafer to be ground. That is, the grinding tooth 110 functions as the grinder during the grinding process. FIG. 2 is a schematic top view showing the relative grinding trajectory of the grinding wheel over the wafer to be ground in a manufacturing process of a semiconductor package according to some exemplary embodiments of the present disclosure. As seen in FIG. 2, when the grinding wheel 100 moves toward the wafer W in a specific direction (marked as the arrow), as some of the grinding teeth 110 arranged on the bottom surface of the metal base 102 directly contacts the wafer surface, a contact area CA is defined between the contact surface 110a (FIG. 1C) of the grinding teeth 110 and the wafer surface, and such contact area is the grinding area of the grinding wheel. It is appreciated that the contact area or grinding area of the grinding wheel varies along different moving trajectories of the grinding wheel, but the wafer or the intermediate package structure should be ground as a whole, globally reducing the height (or thickness) with uniformity.

Referring to FIGS. 1C and 1D, in some embodiments, the grinding tooth 110 includes a grinding material. In some embodiments, the grinding tooth 110 is a block structure made of the grinding material 1100 or at least the outermost portion of the block of the grinding tooth 110 includes the grinding material 1100. In some embodiments, the grinding material 1100 includes at least abrasive particles 1102 mixed within and bonded by a bond material 1104. In some embodiments, as seen in FIG. 1D, the framework structure of the grinding material 110 includes large-sized pores PV distributed within the scaffold constituted by the bonded abrasive particles 1102 (bonded by the bond material 1104). In some embodiments, the grinding material 1100 includes pores (air holes) PV taking at least 55% volume per volume (% v/v) of the total volume of the grinding material 1100. In some embodiments, the pore size of the pores PV is larger than about 40 microns but smaller than 70 microns and may range from about 40 microns to about 60 microns. For the grinding material having small pores of about 20 microns (smaller than 40 microns), inferior grinding capability is observed with copper clogged or remained on the grinding teeth. For the grinding material having pores larger than 70 microns, the grinding teeth may often suffer deterioration. As the pore size of the pores within the grinding material is relatively large, the grinding material described in the exemplary embodiments herein may be referred to as "large-pore" grinding material(s). In certain embodiments, the bond material includes a resin binder, and the resin binder contains a thermosetting resin. In some embodiments, the thermosetting resin includes one or more materials selected from phenol resins, synthetic rubber resins or urethane resins. In some embodiments, the abrasive particles or grains include diamond particles, alumina particles, silicon carbide particles, cubic boron nitride particles or the like. In some embodiments, the particle size of the abrasive particles ranges from about 1.5 microns to about 20 microns. In one embodiment, the abrasive particles are diamond particles (diamond grits) having an average particle size ranging from about 3 microns to about 20 microns. In some embodiments, the pores (in total) takes at least 55% v/v or about 55~70% v/v of the total volume of the grinding material, while the other proportion consisting of the bond material and the abrasive grains takes about 45~30% v/v of the total volume of the bond material. In one embodiment, the pores (in total) takes at least 60% v/v of the total volume of the grinding material, while the other proportion consisting of the bond material and the abrasive grains takes about 40% v/v of the total volume of the bond material. In some embodiments, for the proportion consisting of the bond material and the abrasive particles, the weight ratio of the abrasive particles to the bond material ranges from 3:1 to 5:1. In one embodiment, for the proportion consisting of the bond material and the abrasive particles, the weight ratio of the abrasive particles to the bond material ranges from 4.5:1. In some embodiments, for the grinding material, at least some abrasive particles are exposed from the bond material at the outermost surface (contact surface) of the grinding tooth 110. It is appreciated that the particle size of the abrasive particles may be adjusted or selected depending on the desirable grinding rate of the grinding process and the surface roughness requirements of the wafer or package to be ground. In some embodiments, the grinding material may be formed by calcining a mixture of the bond material and the abrasive particles or grains.

Figure 4A:
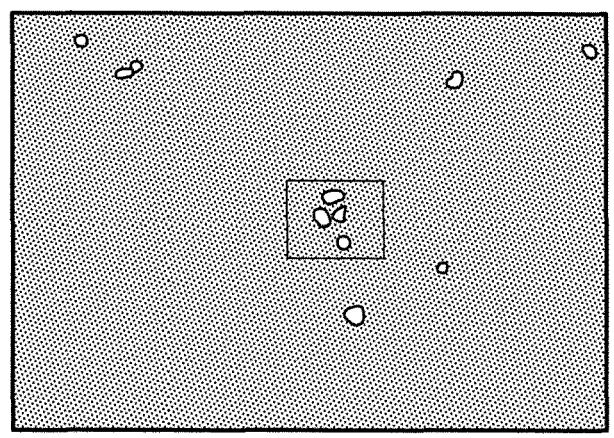
FIGS. 4A-4B are partial microscopic views of a large-pore grinding material of the grinding tooth of a grinding wheel according to some exemplary embodiments of the present disclosure.
Figure 4B:
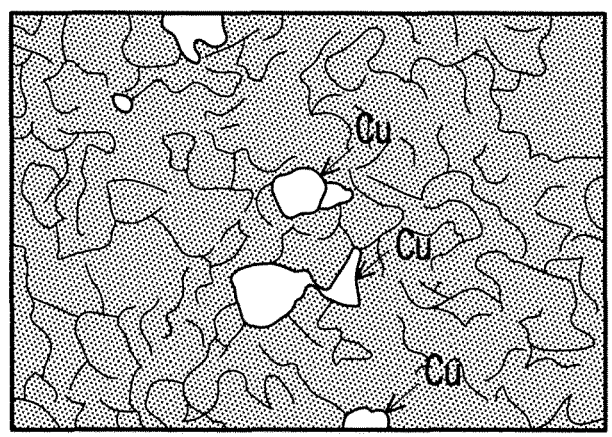

FIGS. 4A-4B are partial microscopic views of the large-pore grinding material according to some exemplary embodiments of the present disclosure after grinding a metal-containing structure. In exemplary embodiments, the large-pore grinding material, similar to the grinding material 1100 of FIG. 1D, includes pores (air holes) PV taking about 60% v/v of the total volume of the grinding material, while the other proportion consisting of the bond material and the abrasive grains takes about 40% v/v of the total volume of the bond material. Also, in some embodiments, for the large-pore grinding material, the pore size of the pores ranges from about 40 microns to about 60 microns and the abrasive particles are diamond particles (diamond grits) having an average particle size ranging from about 3 microns to about 5 microns. In some embodiments, for the large-pore grinding material, within the proportion consisting of the bond material and the abrasive particles, the weight ratio of the abrasive particles to the bond material ranges from 4.5:1. As seen in FIGS. 4A-4B, large-sized pores are seen between the abrasive particles bonded by the bond material in the grinding material and metal residues (e.g. copper residues) are observed as white spots in the circled region in FIG. 4A and in the enlarged view of FIG. 4B as pointed by the arrows marked "Cu". Satisfactory and well controlled grinding results are noticed for the metal-containing structure ground by the grinding wheel with the grinding teeth of the large-pore grinding material of FIG. 4A or FIG. 4B.

In exemplary embodiments, various materials including molding compound materials, copper/copper alloys and polymer materials are tested and ground by grinding wheels with grinding teeth made of different grinding materials. In some embodiments, for grinding applicable materials (including molding compound materials, copper/copper alloys and polymer materials) of a package structure, high-quality total thickness variation (TTV) equivalent to or smaller than about 2 microns (as small as 0.3 microns) can be achieved by using the grinding wheel having the grinding teeth of the large-pore grinding material as described above.

Figure 5A:
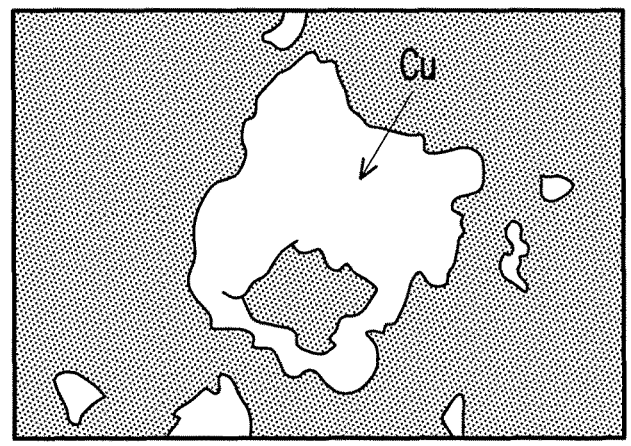
FIGS. 5A-5B are partial microscopic views of a comparative grinding material of the grinding tooth of a grinding wheel.
Figure 5B:
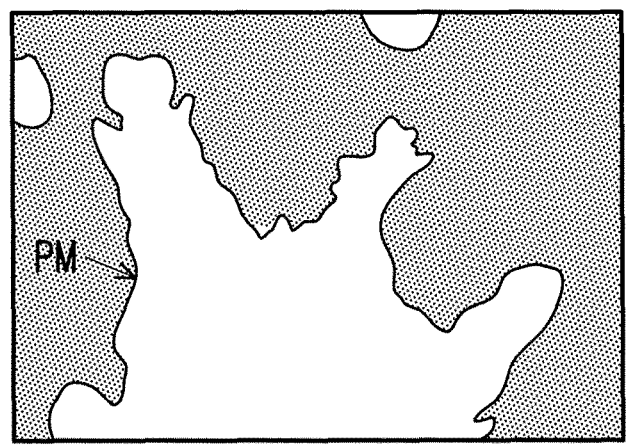

FIGS. 5A-5B are partial microscopic views of a comparative grinding material after grinding a metal-containing structure. For comparison, the comparative grinding material is prepared to include pores taking less than 35% v/v of the total volume of the grinding material and the other proportion consisting of the bond material and the abrasive grains taking about 65% v/v of the total volume of the bond material. For this comparative grinding material, the pore size of the pores is about 20 microns, and the ratio of the abrasive particles to the bond material is about 1:7. As seen in FIGS. 5A-5B, extensive metal residues (e.g., copper residues) are observed as large white spots (pointed by the arrow marked "Cu") in FIG. 5A and considerable polymer residues are observed (pointed by the arrow marked "PM") in FIG. 5B. From the grinding result using the comparative grinding material of FIG. 5A, over-grinding or dishing of the metal is noticed for the metal-containing structure ground by the grinding wheel having the grinding teeth of the comparative grinding material of FIG. 5A. From the grinding results of this comparative grinding material, inferior uniformity is observed.

Through comparison of the large-pore grinding material and the comparative grinding material, it is appreciated that the large-pore grinding material as described in this disclosure provides better grinding uniformity and improved grinding yield for grinding various materials over either a semiconductor wafer or of a package structure. Also, as less residues are remained on the grinding material or the grinding teeth of this disclosure, the grinding teeth are more durable to provide better grinding capacity and extended grinding lifespan.

In some embodiments, the grinding wheel may be applicable for any suitable structure including a semiconductor wafer, a die and package structures. For thinning a wafer or an intermediate wafer-level package structure, silicon, semiconductor compound materials, metal or metallic materials or encapsulating or molding materials may be removed or ground by the grinding wheel having grinding teeth of the large-pore grinding material during a grinding process. The grinding process may include coarse grinding and/or fine grinding process(es).

FIG. 3A to FIG. 3H are schematic cross sectional views of various stages in a manufacturing method of a semiconductor package according to some exemplary embodiments. In exemplary embodiments, the semiconductor manufacturing method is part of a packaging process. In some embodiments, one or more chips or dies are shown to represent plural chips or dies of the wafer, and one or more packages are shown to represent plural semiconductor packages obtained following the semiconductor manufacturing method.

Figure 3A:
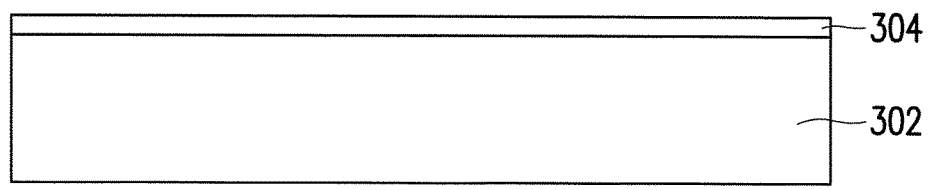
FIGS. 3A-3H are schematic cross sectional views of various stages in a manufacturing process of a semiconductor package according to some exemplary embodiments of the present disclosure.

Referring to FIG. 3A, in some embodiments, a carrier 302 with a buffer layer 304 coated thereon is provided, the carrier 302 may be a glass carrier or any suitable carrier for carrying a semiconductor wafer or a reconstituted wafer for the manufacturing method of the semiconductor package. In some embodiments, the buffer layer 304 includes a debond layer and the debond layer may include, for example, a light-to-heat conversion ("LTHC") layer. Referring to FIG. 3A, in some embodiments, the buffer layer 304 includes an adhesive layer or a die attach film. In certain embodiments, the buffer layer 304 includes a dielectric material layer comprising benzocyclobutene ("BCB"), polybenzooxazole ("PBO"), or any other suitable polymer-based dielectric material.

Figure 3B:
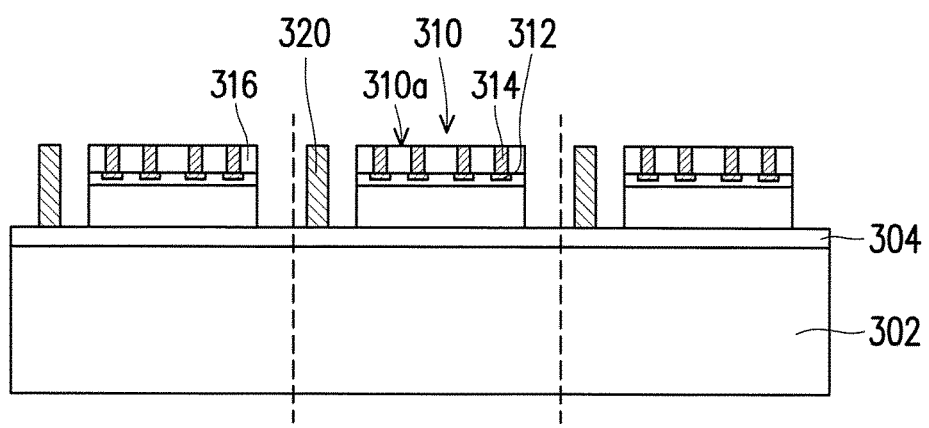

Referring to FIG. 3B, in some embodiments, through interlayer vias ("TIVs") 320 are formed on the buffer layer 304 over the carrier 302. In some embodiments, the TIVs 320 are through integrated fan-out ("InFO") vias. In some embodiments, the formation of the TIVs 320 includes forming a mask pattern (not shown) with openings on the buffer layer 304, then forming a metallic material (not shown) filling up the openings by electroplating or deposition, and removing the mask pattern to form the TIVs 320 on the buffer layer 304. In some embodiments, the formation of the TIVs 320 includes forming a seed layer 306 (not shown) by firstly sputtering a composite layer of a titanium layer and a copper seed layer (not shown) over the buffer layer 304 on the carrier 302, while the TIVs 320 are subsequently formed by electroplating the metallic material (such as copper or a copper alloy) to fill the openings of the mask pattern. However, it is appreciated that the scope of this disclosure is not limited to the materials and descriptions disclosed above.

Referring to FIG. 3B, more than one chip 310 is provided and disposed on the exposed buffer layer 304 opposite to the carrier 302. In exemplary embodiments, the chips 310 may include the same types of chips or different types of chips or and may be digital chips, analog chips or mixed signal chips, such as application-specific integrated circuit ("ASIC") chips, sensor chips, wireless and radio frequency chips, memory chips, logic chips or voltage regulator chips. In some embodiments, the chip 310 includes pads 312 on the active surface 310a and metal posts 314 located on the pads 312. In exemplary embodiments, the pads 312 are aluminum contact pads. In one embodiment, the metal posts 314 are copper posts or copper alloy posts. In certain embodiment, the chip 310 is pre-molded and the metal posts 314 located on the pads 312 of the chip 310 are covered by a dielectric material 316. In some embodiments, the buffer layer 304 includes the die attach film and the backsides of the chips 310 are adhered to the buffer layer 304 on the carrier 302, while the active surface 310a of the chip faces upward. In alternative embodiments, before placing the chips 310 on the carrier 302, the metal posts 314 on the chips 310 are uncovered (i.e. bare dies not molded or encapsulated) and a die attach film may be attached to the backside of the chip 310. In some embodiments, the chips 310 are placed over the carrier 302 and arranged aside the TIVs 320 (within the area surrounding by the TIVs). In some embodiments, the TIVs 320 are formed before the placement of the chips 310. In some embodiments, the TIVs 320 are formed after the placement of the chips 310. In some embodiments, as shown in FIG. 3B, the dotted line represents the cutting line of the whole package 300 in the subsequent cutting process and some of the TIVs 320 are arranged close to but not on the cutting line, and are arranged around the chips 310.

Figure 3C:
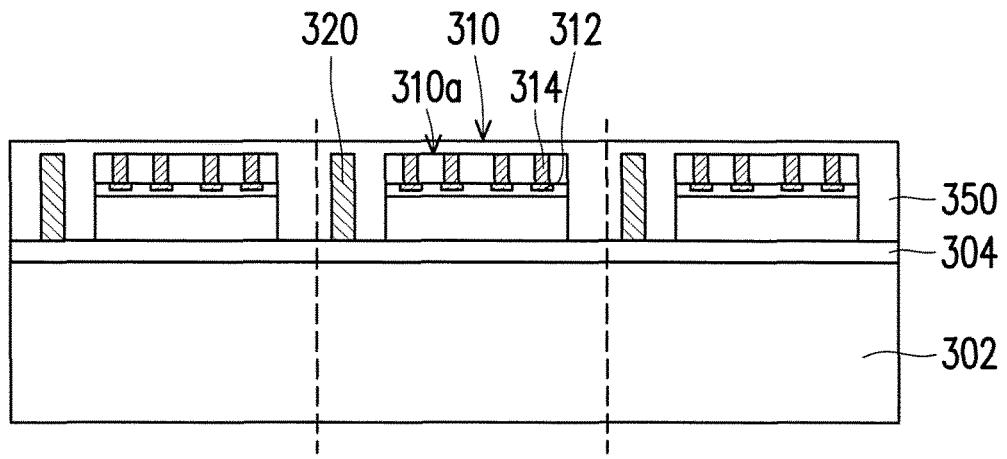

Referring to FIG. 3C, in some embodiments, a molding compound 350 is formed over the carrier 302 and the chips 310 on the buffer layer 304 and the TIVs 320 located over the carrier 302 beside the chips 310 are molded in the molding compound 350. In some embodiments, the molding compound 350 covers the buffer layer 304 and fills between the chips 310 and the TIVs 320. In certain embodiments, the molding compound 350 fully covers the TIVs 320 and the chips 310. In some embodiments, the molding compound 350 over-molds the chips 310 and the TIVs 320 with a height exceeding the height/thickness of the chips 310 and the TIVs 320. In one embodiment, the material of the molding compound 350 includes at least one type of resins selected from epoxy resins, phenolic resins and silicon-containing resins.

Figure 3D:
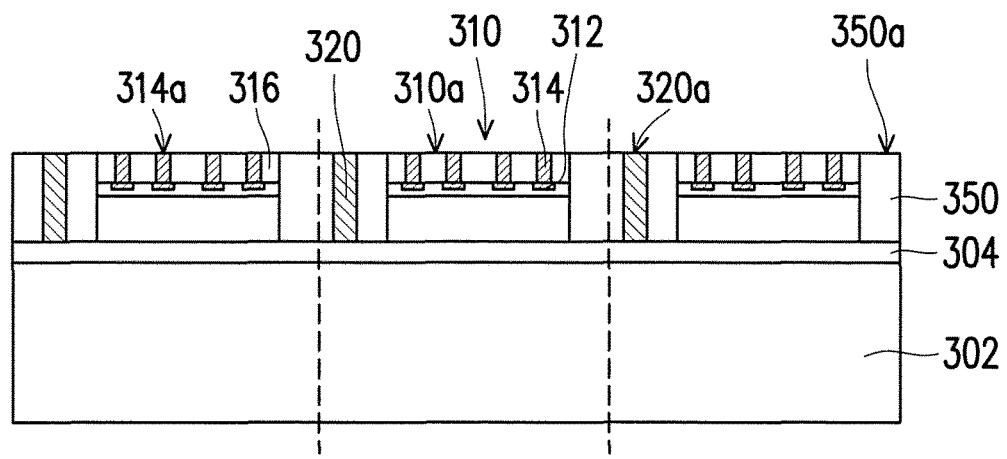

Referring to FIG. 3D, in some embodiments, a grinding process is performed to the molding compound 350 to reduce the height of the molding compound 350, thus exposing the metal posts 314 of the chips 310 and the TIVs 320. In certain embodiments, through the grinding, the metal posts 314, the TIVs 320 and the molding compound 350 become flattened and substantially levelled. In alternative embodiments, after grinding, the top surface 350a of the molding compound 350 may be substantially levelled with the top surfaces 320a of the TIVs 320 and top surfaces 314a of the metal posts 314 of the chip 310. In some embodiments, the grinding process is performed using the grinding wheel having the grinding teeth of the large-pore grinding material. In certain embodiments, the grinding tooth is made of the large-pore grinding material has a framework structure including large-sized pores distributed between the framework composed of bonded abrasive particles that are bonded by a bond material (FIG. 1D). In some embodiments, the large-pore grinding material includes pores (air holes) taking at least 55% volume per volume (% v/v) of the total volume of the grinding material, the pore size of the pores is larger than about 40 microns but smaller than about 70 microns, the particle size of the abrasive particles ranges from about 1.5 microns to about 20 microns, and the weight ratio of the abrasive particles to the bond material ranges from 3:1 to 5:1. In certain embodiments, the bond material includes a resin binder, and the resin binder contains a thermosetting resin. In some embodiments, the abrasive particles or grains include diamond particles, alumina particles, silicon carbide particles, cubic boron nitride particles or the like. In one embodiment, the abrasive particles are diamond particles (diamond grits) having an average particle size ranging from about 3 microns to about 20 microns. In one embodiment, the pores (in total) takes at least 60% v/v of the total volume of the grinding material, while the other proportion consisting of the bond material and the abrasive grains takes about 40% v/v of the total volume of the bond material. In one embodiment, for the proportion consisting of the bond material and the abrasive particles, the weight ratio of the abrasive particles to the bond material ranges from 4.5:1.

As shown in FIG. 3D, the molding compound 350 does not cover the entirety of the TIVs 320 and the metal posts 314 with the top surfaces 314a of the metal posts 314 and the top surfaces 320a of the TIVs 320 exposed from the molding compound 350. In some embodiments, after grinding the molding compound 350 with the grinding process using the grinding wheel having the grinding teeth of the large-pore grinding material as described above, well-controlled and better surface smoothness and flatness of the molding compound 350 is achievable. In some embodiments, the surface roughness (Ra) of the ground molding compound 350 is less than 2 microns or even as small as 0.3~0.5 microns. In certain embodiments, especially for the grinding process performed toward the molding compound 350 and the TIVs (and/or metal posts 314) embedded within the molding compound 350, small TTVs values and small surface roughness values are attained. Improved surface smoothness and flatness of the package structure can be achieved by applying the disclosed grinding process using the grinding wheel having the grinding teeth of the large-pore grinding material as described above. In certain embodiments, little or no pits are generated on the surface(s) of the ground structure (e.g. the TIVs and the molding compound), resulting in small surface roughness and better surface evenness.

Figure 3E:
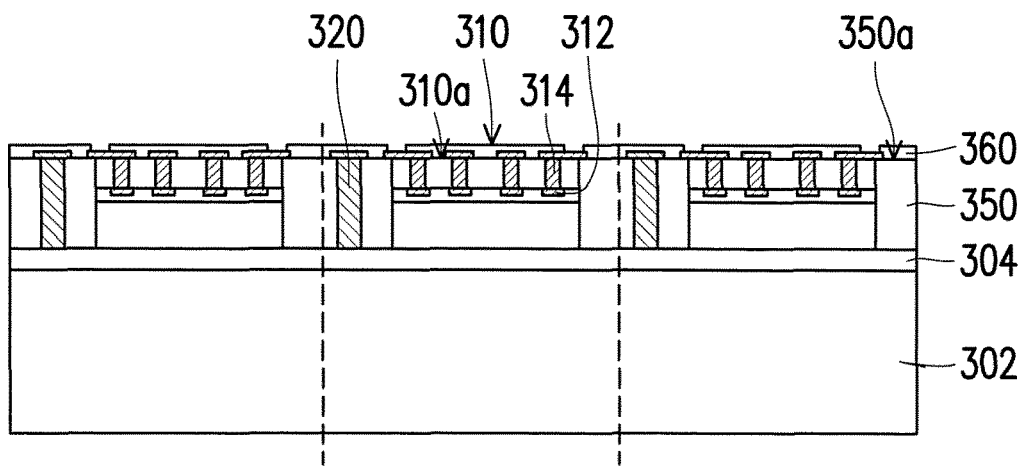

Referring to FIG. 3E, in some embodiments, a redistribution layer 360 is formed on the molding compound 350, over the metal posts 314 of the chips 310 and on the TIVs 320. In some embodiment, the redistribution layer 360 is electrically connected to the TIVs 320 and the metal posts 314 of the chips 310. In certain embodiments, the formation of the redistribution layer 360 includes sequentially forming one or more dielectric material layers and one or more metallization layers in alternation, and the metallization layer(s) may be sandwiched between the dielectric material layer(s). In some embodiments, the material of the metallization layer(s) includes aluminum, titanium, copper, nickel, tungsten, silver and/or alloys thereof. In some embodiments, the material of the dielectric material layer(s) includes polyimide, benzocyclobutene, or polybenzooxazole. In some embodiments, the redistribution layer 360 is a front-side redistribution layer electrically connected to the chips 310 and is electrically connected to the TIVs 320. In certain embodiments, as the underlying molding compounds 350 provides better planarization and evenness, the later-formed redistribution layer 360, especially the metallization layer with thin line width or tight spacing, can be formed with uniform line-widths and/or improved line/wiring reliability.

Figure 3F:
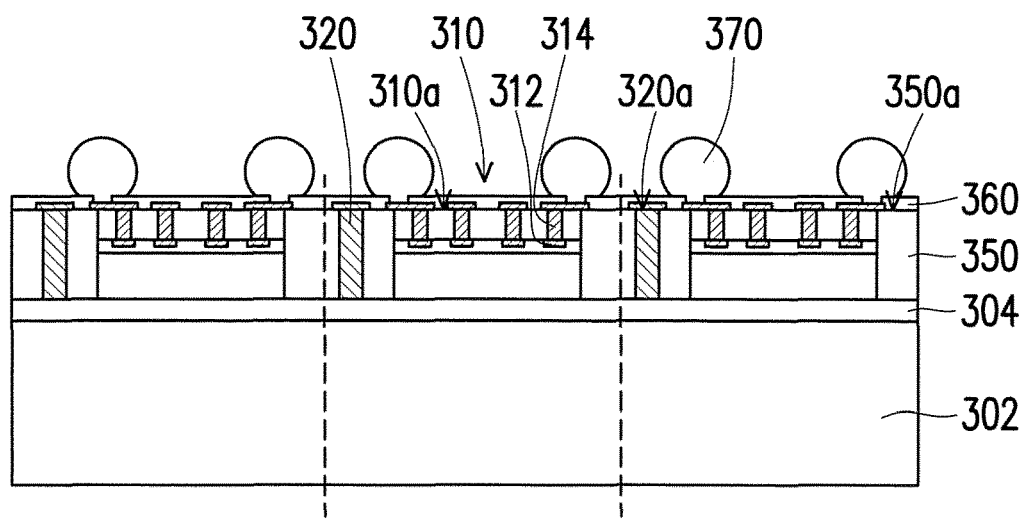

Referring to FIG. 3F, in some embodiments, the conductive elements 370 are disposed on the redistribution layer 360 and are electrically connected to the redistribution layer 360. In some embodiments, prior to disposing the conductive elements 370, flux may be applied for better attachment. In some embodiments, the conductive elements 370 are, for example, solder balls or ball grid array ("BGA") balls placed on the redistribution layer 360. In some embodiments, some of the conductive elements 370 are electrically connected to the chips 310 through the redistribution layer 360, and some of the conductive elements 370 are electrically connected to the TIVs 320.

Figure 3G:
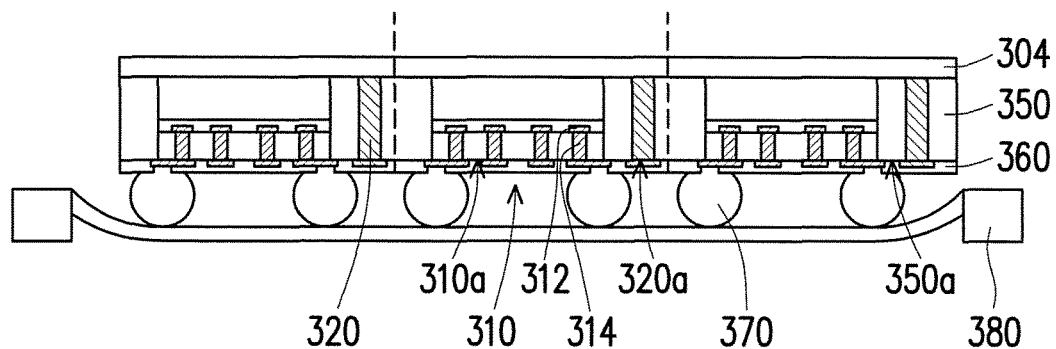

Referring to FIG. 3G, in some embodiments, the whole package is turned upside down and disposed on a carrier film 380. In some embodiments, the whole package 300 is debonded from the carrier 302 to separate the chips 310 from the carrier 302. In some embodiments, after debonding from the carrier 302, the buffer layer 304 is exposed and remains on the molding compound 350 and the chips 310. In some embodiments, after debonding from the carrier 302, the buffer layer 304 is removed through an etching process or a cleaning process.

Figure 3H:
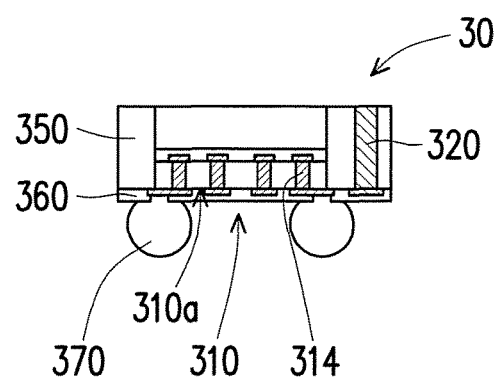

Referring to FIG. 3H, in certain embodiments, a dicing process is performed to cut the whole package structure (at least cutting though the molding compound 350 and the redistribution layer 360) along the cutting line (the dotted line) into individual and separated semiconductor packages 30. In one embodiment, the dicing process is a wafer dicing process including mechanical blade sawing or laser cutting.

According to some embodiments, a grinding element of a grinding wheel includes a grinding tooth. The grinding tooth includes a grinding material. The grinding material has a framework structure including abrasive particles and a bond material bonding the abrasive particles, and pores distributed in the framework structure. A pore size of the pores is greater than 40 microns and less than 70 microns.

According to some embodiments, a grinding wheel including a ring shaped metal base and a plurality of grinding teeth mounted on a surface of the metal base. The plurality of grinding teeth is separate from one another by a distance and are arranged along an outer rim portion of the metal base. Each of the plurality of grinding teeth includes a grinding material having a framework structure including abrasive particles and a bond material bonding the abrasive particle, and pores distributed in the framework structure. The pores take about 55% volume per volume (% v/v) to about 70% v/v of a total volume of the grinding material.

According to some embodiments, a manufacturing method for semiconductor packages is described. A carrier is provided. Through vias are formed and chips are disposed on the carrier. A molding compound is formed to encapsulate the chips and the through vias. The molding compound is ground using a grinding wheel having grinding teeth including a grinding material to expose the through vias. The grinding material includes a framework structure including abrasive particles and bond material bonding the abrasive particles, and pores distributed in the framework structure, and a pore size of the pores being larger than 40 microns and smaller than 70 microns. A redistribution layer is formed on the molding compound and on the chips. The redistribution layer is electrically connected to the through vias and the chips. Conductive elements are mounted on the redistribution layer. The conductive elements are electrically connected to the chips and the through vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A grinding element of a grinding wheel, comprising:
   a grinding tooth including a grinding material having
   a framework structure comprising abrasive particles and a bond material bonding the abrasive particles, wherein the bond material is a resin bond material, and
   pores distributed in the framework structure,
   wherein a pore size of the pores is greater than 40 microns and less than 70 microns, and the pores take about 55% volume per volume (% v/v) to about 70% v/v of a total volume of the grinding material.

2. The element according to claim 1, wherein the pores take about 60% v/v of the total volume of the grinding material.

3. The element according to claim 1, wherein a particle size of the abrasive particles ranges from about 1.5 microns to about 20 microns, and a weight ratio of the abrasive particles to the bond material ranges from 3:1 to 5:1.

4. The element according to claim 3, wherein the particle size of the abrasive particles ranges from about 3 microns to about 20 microns, and the weight ratio of the abrasive particles to the bond material is about 4.5:1.

5. The element according to claim 1, wherein the bond material includes a thermosetting resin binder.

6. The element according to claim 1, wherein the abrasive particles include diamond particles, alumina particles, silicon carbide particles or cubic boron nitride particles.

7. The element according to claim 1, wherein the pore size of the pores ranges from about 40 microns to about 60 microns, the abrasive particles are diamond particles having an average particle size ranging from about 3 microns to about 20 microns, and a weight ratio of the abrasive particles to the bond material is about 4.5:1.

8. A grinding wheel, comprising:
   a ring shaped metal base; and
   a plurality of grinding teeth mounted on a surface of the metal base,
   wherein the plurality of grinding teeth is separate from one another by a distance and are arranged along an outer rim portion of the metal base,
   wherein each of the plurality of grinding teeth includes a grinding material having a framework structure including abrasive particles and a bond material bonding the abrasive particle, and pores distributed in the framework structure, wherein the bond material is a resin bond material, and
   wherein the pores take about 55% volume per volume (% v/v) to about 70% v/v of a total volume of the grinding material, a pore size of the pores is greater than 40 microns and less than 70 microns, and a weight ratio of the abrasive particles to the bond material ranges from 3:1 to 5:1.

9. The wheel according to claim 8, wherein each of the plurality of grinding teeth is a block structure made of the grinding material.

10. The wheel according to claim 8, wherein each of the plurality of grinding teeth is a rectangular block and at least an outermost portion of the block includes the grinding material.

11. The wheel according to claim 8, wherein the bond material includes at least one material selected from phenol resins, synthetic rubber resins or urethane resins.

12. The wheel according to claim 8, wherein the pores take about 60% v/v of the total volume of the grinding material.

13. The wheel according to claim 8, wherein a particle size of the abrasive particles ranges from about 1.5 microns to about 20 microns.

14. The wheel according to claim 13, wherein the particle size of the abrasive particles ranges from about 3 microns to about 20 microns, and the weight ratio of the abrasive particles to the bond material is about 4.5:1.

15. The wheel according to claim 8, wherein the bond material includes a thermosetting resin binder, and the abrasive particles include diamond particles, alumina particles, silicon carbide particles or cubic boron nitride particles.

16. The wheel according to claim 8, wherein a pore size of the pores ranges from about 40 microns to about 60 microns, the abrasive particles are diamond particles having an average particle size ranging from about 3 microns to about 20 microns, and a weight ratio of the abrasive particles to the bond material is about 4.5:1.

17. A manufacturing method for a semiconductor package, comprising:
    providing a carrier;
    forming through vias on the carrier and disposing chips on the carrier;
    forming a molding compound encapsulating the chips and the through vias;
    grinding the molding compound using a grinding wheel having grinding teeth including a grinding material, so as to expose the through vias;
    forming a redistribution layer on the molding compound and on the chips, wherein the redistribution layer is electrically connected to the through vias and the chips; and
    mounting conductive elements on the redistribution layer, wherein the conductive elements are electrically connected to the chips and the through vias, and
    wherein the grinding material includes a framework structure including abrasive particles and a resin bond material bonding the abrasive particles, and pores distributed in the framework structure taking about 55% volume per volume (% v/v) to about 70% v/v of a total volume of the grinding material, and a pore size of the pores being larger than 40 microns and smaller than 70 microns.

18. The method according to claim 17, wherein the grinding the molding compound comprises grinding the molding compound to expose metal posts of the chips.

19. The method according to claim 17, wherein a pore size of the pores ranges from about 40 microns to about 60 microns, the abrasive particles are diamond particles having an average particle size ranging from about 3 microns to about 20 microns, and a weight ratio of the abrasive particles to the resin bond material ranges from 3:1 to 5:1.

* * * * *